United States Patent
Hayakawa et al.

(10) Patent No.: US 10,104,806 B2
(45) Date of Patent: Oct. 16, 2018

(54) SEMICONDUCTOR STORAGE DEVICE

(71) Applicant: TOSHIBA MEMORY CORPORATION, Minato-ku (JP)

(72) Inventors: Toshiyuki Hayakawa, Yokohama (JP); Shiro Harashima, Sagamihara (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/062,359

(22) Filed: Mar. 7, 2016

(65) Prior Publication Data
US 2017/0071075 A1    Mar. 9, 2017

Related U.S. Application Data

(60) Provisional application No. 62/214,666, filed on Sep. 4, 2015.

(51) Int. Cl.
| | | |
|---|---|---|
| *H05K 7/20* | (2006.01) | |
| *H05K 5/02* | (2006.01) | |
| *G06K 19/077* | (2006.01) | |

(52) U.S. Cl.
CPC ..... *H05K 7/2039* (2013.01); *G06K 19/07732* (2013.01); *H05K 5/0278* (2013.01); *H05K 7/20445* (2013.01)

(58) Field of Classification Search
CPC ............... H05K 7/2039; H05K 5/0278; G06K 19/07732
USPC .................. 361/737, 752, 807–810, 816, 818
See application file for complete search history.

(56) References Cited

U.S. PATENT DOCUMENTS

| | | | | |
|---|---|---|---|---|
| 6,163,456 A | * | 12/2000 | Suzuki | H05K 1/141 174/16.3 |
| 6,781,846 B1 | * | 8/2004 | Suzuki | G06F 1/203 361/737 |
| 7,656,026 B2 | * | 2/2010 | Ogata | H01L 23/3675 257/712 |
| 8,670,243 B2 | * | 3/2014 | Mitsuhashi | H05K 1/117 361/679.32 |
| 8,921,993 B2 | * | 12/2014 | Choi | H01L 23/552 257/691 |
| 2005/0156333 A1 | | 7/2005 | Chiou et al. | |
| 2009/0040731 A1 | * | 2/2009 | Jin | H01L 23/02 361/711 |

(Continued)

*Primary Examiner* — Tuan T Dinh
*Assistant Examiner* — Rockshana D Chowdhury
(74) *Attorney, Agent, or Firm* — Oblon, McClelland, Maier & Neustadt, L.L.P.

(57) ABSTRACT

A semiconductor storage device includes a substrate having a wiring, a first semiconductor memory, a terminal portion, a holder surrounding the terminal portion, a case, and a first plate-shaped member. The first semiconductor memory is disposed on a first principal surface of the substrate and is connected to the wiring. The terminal portion is connected to the substrate at a first end portion of the substrate and has a terminal connected to the wiring. The case houses part of the holder, the substrate, and the first semiconductor memory. Between the first principal surface and a first wall portion of the case facing the first principal surface, the first plate-shaped member is disposed. The first plate-shaped member is connected to the holder and the first principal surface on a second end portion side of the substrate, and has thermal conductivity.

20 Claims, 5 Drawing Sheets

(56) References Cited

U.S. PATENT DOCUMENTS

| | | | |
|---|---|---|---|
| 2011/0032679 A1* | 2/2011 | Baek | H01L 23/38 361/715 |
| 2011/0181313 A1* | 7/2011 | Sasaki | H01L 21/67109 324/750.03 |
| 2011/0292621 A1* | 12/2011 | Beaumier | H01L 23/055 361/748 |
| 2012/0020025 A1* | 1/2012 | Sotome | H01G 2/08 361/704 |
| 2012/0320558 A1* | 12/2012 | Foster | H05K 1/0218 361/818 |
| 2013/0134571 A1* | 5/2013 | Kim | H01L 23/473 257/690 |
| 2014/0022733 A1* | 1/2014 | Lim | H05K 7/2039 361/718 |
| 2015/0001689 A1 | 1/2015 | Goetz et al. | |

* cited by examiner

SEMICONDUCTOR STORAGE DEVICE

CROSS REFERENCE TO RELATED APPLICATIONS

This application is based upon and claims the benefit of priority from the prior U.S. Provisional Patent Application No. 62/214,666 filed on Sep. 4, 2015, the entire contents of which are incorporated herein by reference.

FIELD

The present embodiment relates to semiconductor storage devices.

BACKGROUND

Along with increase in the quantity of handled data in semiconductor storage devices such as SD cards and USB cards, the demands for increasing the speed of processing such as read or write of data have been increasing.

In order to increase the speed of processing, it is required to apply high load to memory ICs and controller ICs mounted on semiconductor storage devices.

DETAILED DESCRIPTION

A semiconductor storage device of the present embodiment is provided with a substrate, a first semiconductor memory, a terminal portion, a holder, a case, and a first plate-shaped member. The substrate has a wiring. The first semiconductor memory is disposed on a first principal surface of the substrate and is connected to the wiring. The terminal portion is connected to the substrate at a first end portion of the substrate and has a terminal connected to the wiring. The holder surrounds the terminal portion. The case houses part of the holder, the substrate, and the first semiconductor memory. Between the first principal surface and a first wall portion of the case facing the first principal surface, the first plate-shaped member is disposed so as to be separated from the first semiconductor memory and the case. The first plate-shaped member is connected to the holder at a first end, is connected to the first principal surface on a second end portion side of the substrate at a second end, and has thermal conductivity.

Embodiments will now be explained with reference to the accompanying drawings. The present invention is not limited to the embodiments.

(First Embodiment)

Figure 1:
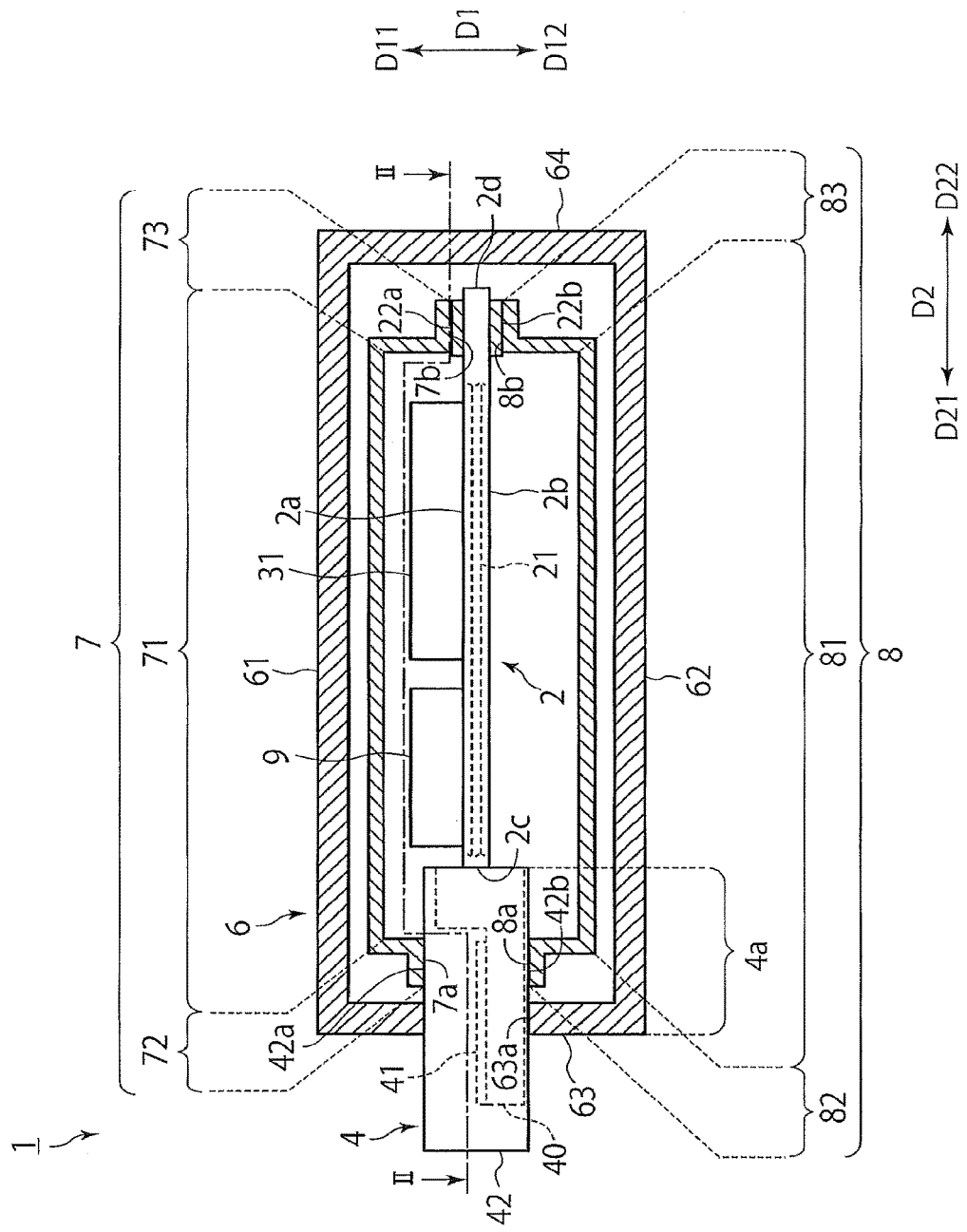
FIG. 1 is a schematic cross-sectional view of a semiconductor storage device showing a first embodiment.
Figure 2:
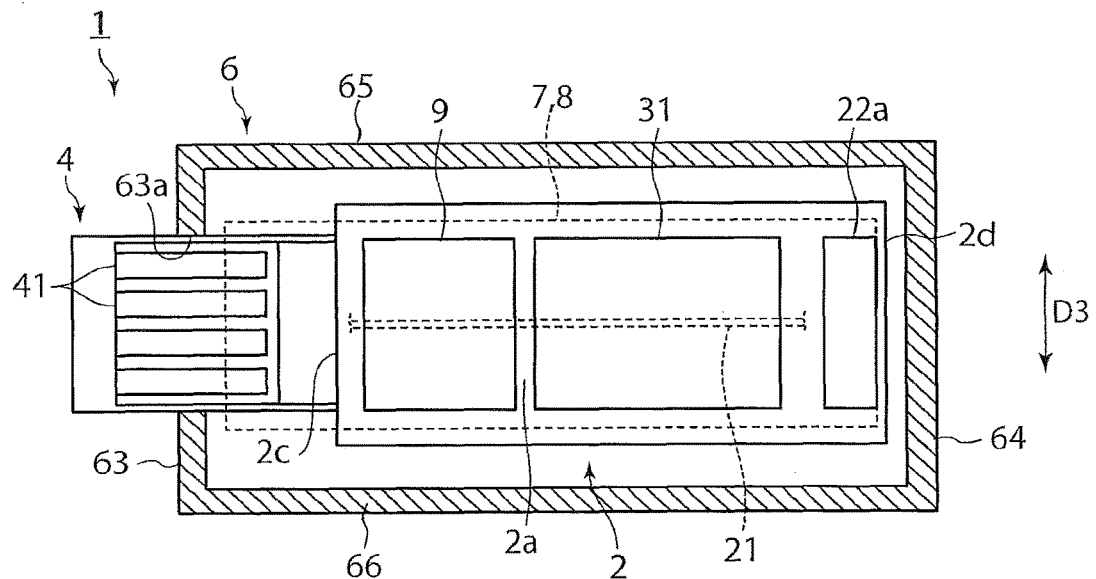
FIG. 2 is a II-II cross-sectional view of FIG. 1 showing the semiconductor storage device of the first embodiment.

First, as a first embodiment, a semiconductor storage device provided with a first plate-shaped member and a second plate-shaped member will be explained. FIG. 1 is a schematic cross-sectional view of a semiconductor storage device 1 showing the first embodiment. FIG. 2 is a II-II cross-sectional view of FIG. 1 showing the semiconductor storage device 1 of the first embodiment.

The semiconductor storage device 1 of the first embodiment is, for example, a USB memory.

As shown in FIG. 1, the semiconductor storage device 1 of the first embodiment is provided with a substrate 2, a first memory package 31 which is an example of a first semiconductor memory, a connector 4, and a case 6. The connector 4 is provided with a terminal portion 40 and a holder 42. The semiconductor storage device 1 is also provided with a first plate-shaped member 7, a second plate-shaped member 8, and a controller 9.

The substrate 2 has a first principal surface 2a and a second principal surface 2b on the opposite side. The first principal surface 2a and the second principal surface 2b are opposed to each other in a thickness direction of the substrate 2, in other words, in a height direction D1 of the semiconductor storage device 1.

(Substrate 2)

The substrate 2 has a plurality of wirings. The plurality of wirings may include, for example, a wiring disposed on the first principal surface 2a for electronic component packaging and a wiring disposed in the substrate 2 for data transfer. The wiring may be disposed on the second principal surface 2b. FIG. 1 schematically shows a ground wiring 21 disposed in the substrate 2 among the plurality of wirings. The ground wiring 21 is connected to a first connecting pad 22a disposed on the first principal surface 2a. The ground wiring 21 is also connected to a second connecting pad 22b disposed on the second principal surface 2b.

(First Memory Package 31)

The first memory package 31 is disposed on the first principal surface 2a of the substrate 2 and is connected to predetermined wirings including the ground wiring 21. The first memory package 31 incorporates a memory chip of a non-volatile semiconductor memory such as a NAND-type flash memory. The first memory package 31 can transmit/receive data at high speed to/from the controller 9 through the wiring. In FIG. 1, the first memory package 31 is disposed at a position that is more distant from the connector 4 than the controller 9 is.

(Terminal Portion 40, Holder 42)

The terminal portion 40 of the connector 4 is connected to the substrate 2 at a first end portion 2c, in other words, a front end portion of the substrate 2. The terminal portion 40 has terminals 41 connected to the wiring. The holder 42 of the connector 4 surrounds the terminal portion 40. The holder 42 has thermal conductivity and electrical conductivity. The holder 42 is, for example, metal.

(Case 6)

The case 6 is formed in a hollow cuboidal shape. Specifically, the case 6 has: an upper wall portion 61, which is an example of a first wall portion; a bottom wall portion 62, which is an example of a second wall portion; a front wall portion 63; a rear wall portion 64; and left/right lateral wall portions 65 and 66. The upper wall portion 61 and the bottom wall portion 62 are opposed to each other in the height direction D1 of the semiconductor storage device 1. The front wall portion 63 and the rear wall portion 64 are opposed to each other in a total-length direction D2 of the semiconductor storage device 1. As shown in FIG. 2, the left lateral wall portion 65 and the right lateral wall portion 66 are opposed to each other in a width direction D3 of the semiconductor storage device 1.

As shown in FIG. 1, an opening 63a, which allows the connector 4 to penetrate therethrough, is present in the front wall portion 63. The case 6 is housing a portion 4a of the connector 4 (in other words, the holder 42 and the terminal portion 40), the substrate 2, and the first memory package 31. The remaining portion of the connector 4 is exposed to outside the connector 4 through the opening 63a.

The upper wall portion 61 faces the first principal surface 2a. In other words, the upper wall portion 61 is opposed to the first principal surface 2a in an upward direction D11, which is a surface-normal direction of the first principal surface 2a. The bottom wall portion 62 faces the second principal surface 2b. In other words, the bottom wall portion 62 is opposed to the second principal surface 2b in a downward direction D12, which is a surface-normal direction of the second principal surface 2b.

(First Plate-Shaped Member 7)

The first plate-shaped member 7 is disposed between the first principal surface 2a and the upper wall portion 61 so as to be separated from the first memory package 31 and the case 6. The first plate-shaped member 7 is disposed to be separated also from the controller 9.

The first plate-shaped member 7 has a first plate-shaped portion 71, a second plate-shaped portion 72, and a third plate-shaped portion 73. The first plate-shaped portion 71 extends in the total-length direction D2 so as to face the controller 9 and the first memory package 31. The second plate-shaped portion 72 is connected to the first plate-shaped portion 71 at a front end portion of the first plate-shaped portion 71. The second plate-shaped portion 72 extends to the lower side D12 from the front end portion of the first plate-shaped portion 71 and is bent to a front side D21 at a lower end portion of the second plate-shaped portion 72. The third plate-shaped portion 73 is connected to the first plate-shaped portion 71 at a rear end portion of the first plate-shaped portion 71. The third plate-shaped portion 73 extends to the lower side D12 from the rear end portion of the first plate-shaped portion 71 and is bent to a rear side D22 at a lower end portion of the third plate-shaped portion 73.

As shown in FIG. 2, the first plate-shaped member 7 is formed to be larger than the first memory package 31, the controller 9, and the connector 4 in the width direction D3.

The first plate-shaped member 7 has thermal conductivity and electrical conductivity. The first plate-shaped member 7 is, for example, metal. The first plate-shaped member 7 may be integrally formed of metal.

As shown in FIG. 1, the first plate-shaped member 7 is connected to the holder 42 at a first end face 7a serving as a first end thereof, in other words, at a lower end face of the second plate-shaped portion 72. More specifically, the first end face 7a of the first plate-shaped member 7 is connected to an upper end face 42a of the holder 42.

As shown in FIG. 1, the first plate-shaped member 7 is connected to the first principal surface 2a on the side of a second end portion 2d (rear end portion) of the substrate 2 at a second end face 7b serving as a second end thereof, in other words, at a lower end face of the third plate-shaped portion 73. More specifically, the second end face 7b of the first plate-shaped member 7 is connected to the first connecting pad 22a. In other words, on the first principal surface 2a on the side of the second end portion 2d, the first plate-shaped member 7 is electrically connected to the ground wiring 21 through the first connecting pad 22a.

Since the first plate-shaped member 7 has thermal conductivity and is connected to the first principal surface 2a, which is on the side of the second end portion 2d, and the holder 42, the first plate-shaped member 7 can efficiently release the heat of the substrate 2 on the side of the second end portion 2d, which is difficult to be released to the front side 21 through the ground wiring 21. Moreover, since the first plate-shaped member 7 has electrical conductivity and is electrically connected to the ground wiring 21 and the holder 42, the first plate-shaped member 7 can shield electromagnetic waves, which are generated in high-speed operations of the controller 9 and the first memory package 31.

(Second Plate-Shaped Member 8)

The second plate-shaped member 8 is disposed between the second principal surface 2b and the bottom wall portion 62 so as to be separated from the case 6.

The second plate-shaped member 8 has a first plate-shaped portion 81, a second plate-shaped portion 82, and a third plate-shaped portion 83. The first plate-shaped portion 81 extends in the total-length direction D2 so as to face the second principal surface 2b. The second plate-shaped portion 82 is connected to the first plate-shaped portion 81 at a front end portion of the first plate-shaped portion 81. The second plate-shaped portion 82 extends to the upper side D11 from the front end portion of the first plate-shaped portion 81 and is bent to the front side D21 at an upper end portion of the second plate-shaped portion 82. The third plate-shaped portion 83 is connected to the first plate-shaped portion 81 at a rear end portion of the first plate-shaped portion 81. The third plate-shaped portion 83 extends to the upper side D11 from the rear end portion of the first plate-shaped portion 81 and is bent to the rear side D22 at an upper end portion of the third plate-shaped portion 83.

As well as the first plate-shaped member 7, the second plate-shaped member 8 is formed to be larger than the first memory package 31, the controller 9, and the connector 4 in the width direction D3.

The second plate-shaped member 8 has thermal conductivity and electrical conductivity. The second plate-shaped member 8 is, for example, metal. The second plate-shaped member 8 may be integrally formed of metal.

As shown in FIG. 1, the second plate-shaped member 8 is connected to the connector 4 at a first end face 8a serving as a first end thereof, in other words, at an upper end face of the second plate-shaped portion 82. More specifically, the first end face 8a of the second plate-shaped member 8 is connected to a lower end face 42b of the holder 42.

Moreover, as shown in FIG. 1, at the second end face 8b serving as a second end thereof, in other words, at an upper end face of the third plate-shaped portion 83, the second plate-shaped member 8 is connected to the second principal surface 2b on the side of the second end portion 2d. Specifically, the second end face 8b of the second plate-shaped member 8 is connected to the second connecting pad 22b. In other words, at the second principal surface 2b on the side of the second end portion 2d, the second plate-shaped member 8 is electrically connected to the ground wiring 21 through the second connecting pad 22b.

Since the second plate-shaped member 8 has thermal conductivity and is connected to the second principal surface 2b, which is on the side of the second end portion 2d, and the holder 42, the second plate-shaped member 8 can efficiently release the heat of the substrate 2 on the side of the second end portion 2d which is difficult to be released to the front side 21 through the ground wiring 21.

(Flows of Heat)

Figure 3:
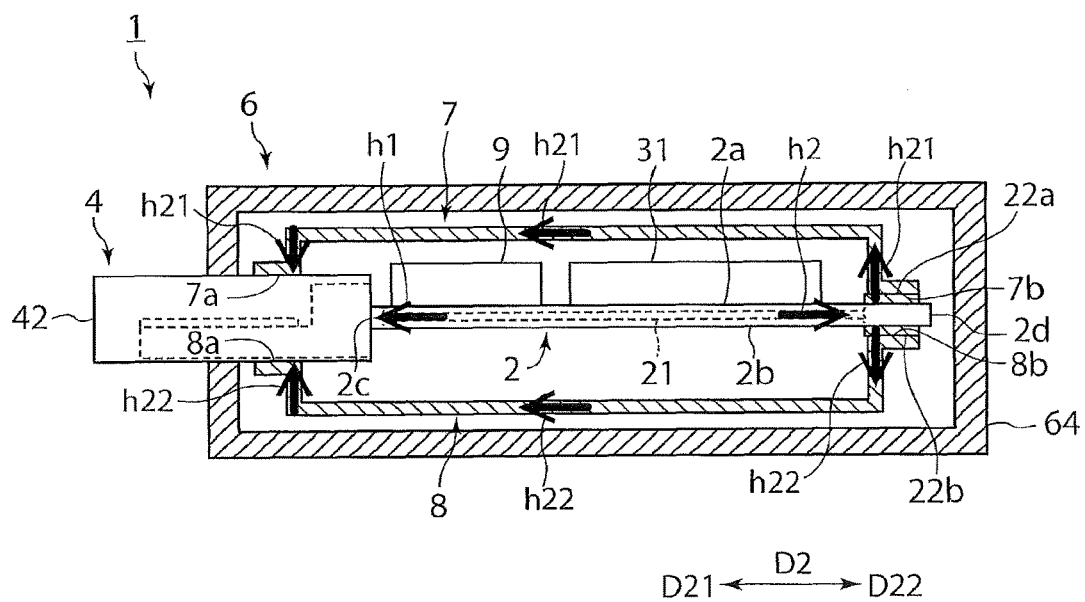
FIG. 3 is a schematic view showing the flows of heat in the semiconductor storage device of the first embodiment.

Next, flows of heat in the semiconductor storage device 1 of the first embodiment will be explained. FIG. 3 is a schematic view showing the flows of heat in the semiconductor storage device 1 of the first embodiment.

In a connected state with an unshown host device, when the controller 9 receives high load from the host device, the controller 9 carries out high-speed operations together with the first memory package 31. The high-speed operations are, for example, a data reading operation from the first memory package 31 and a data writing operation to the first memory package 31. The high-speed operations cause the controller 9 and the first memory package 31 to generate heat.

In this process, heat h1 generated at a position close to the connector 4 such as the heat generated at the controller 9 can reach the connector 4 if the heat is transmitted a comparatively short distance through the ground wiring 21 toward the front side D21. In other words, for the thermal resistance of the ground wiring 21 is small for the heat h1, which is generated at the position close to the connector 4. Therefore, the heat h1, which is generated at the position close to the connector 4, can be easily released from the connector 4 to outside the semiconductor storage device 1, in other words, to the host device side through the ground wiring 21.

On the other hand, heat h2 which is generated at a position distant from the connector 4 such as the heat generated at the first memory package 31 cannot reach the connector 4 unless the heat is transmitted a long distance through the ground wiring 21 toward the front side D21. In other words, the thermal resistance of the ground wiring 21 is large for the heat h2, which is generated at the position distant from the connector 4. Therefore, it is difficult to release the heat h2, which is generated at the position distant from the connector 4, from the connector 4 to outside the semiconductor storage device 1 through the ground wiring 21.

If a heat dissipating path other than the ground wiring 21 is not present, the heat h2, which is generated at the position distant from the connector 4, is accumulated in the case 6 and increases the temperature of the entire semiconductor storage device 1.

On the other hand, in the first embodiment, the first plate-shaped member 7 having thermal conductivity is connected to the first principal surface 2a, which is on the side of the second end portion 2d, and the first plate-shaped member 7 is also connected to the holder 42 of the connector 4. Moreover, as shown in FIG. 2, since the first plate-shaped member 7 is formed to be larger in the width direction D3 compared with the ground wiring 21, the first plate-shaped member 7 has smaller thermal resistance compared with the ground wiring 21.

Therefore, heat h21 which is part of the heat h2 generated at the position distant from the connector 4 can be transmitted a comparatively short distance through the ground wiring 21 toward the rear side D22, reach the first plate-shaped member 7, and then easily released to the holder 42 side through the first plate-shaped member 7. Moreover, since the first plate-shaped member 7 is distant from the case 6, the heat h21, which is transmitted in the first plate-shaped member 7, can be prevented from being transmitted to the case 6.

Moreover, in this process, the second plate-shaped member 8 having thermal conductivity is connected to the second principal surface 2b on the side of the second end portion 2d, and the second plate-shaped member 8 is also connected to the holder 42. Moreover, as shown in FIG. 2, since the second plate-shaped member 8 is formed to be larger in the width direction D3 compared with the ground wiring 21, the second plate-shaped member 8 has smaller thermal resistance compared with the ground wiring 21.

Therefore, heat h22 which is part of the heat h2 generated at the position distant from the connector 4 can be transmitted a comparatively short distance through the ground wiring 21 toward the rear side D22, reach the second plate-shaped member 8, and then be easily released to the holder 42 side through the second plate-shaped member 8. Moreover, since the second plate-shaped member 8 is distant from the case 6, the heat h22, which is transmitted in the second plate-shaped member 8, can be prevented from being transmitted to the case 6.

Moreover, since the substrate 2 is surrounded by the first plate-shaped member 7 and the second plate-shaped member 8 grounded through the ground wiring 21 and the holder 42, the electromagnetic waves generated at the substrate 2 by the high-speed operations of the controller 9 and the first memory package 31 can be shielded. Since the electromagnetic waves can be shielded, malfunctions of electronic equipment (for example, the host device) present around the semiconductor storage device 1 can be prevented.

As explained above, according to the semiconductor storage device 1 of the first embodiment, since the first plate-shaped member 7 and the second plate-shaped member 8 are provided, in high-speed operations of ICs (integrated circuits) such as the controller and the first memory package 31, heat dissipation from the ICs can be efficiently carried out.

The heat dissipation from the controller 9 and the first memory package 31 may be carried out by either one of the first plate-shaped member 7 and the second plate-shaped member 8 by removing the first plate-shaped member 7 or the second plate-shaped member 8.

The heat which can be released from the first plate-shaped member 7 and the second plate-shaped member 8 is not limited to the heat generated by the controller 9 and the first memory package 31 in high-speed operations.

(Modification Examples)

Figure 4:
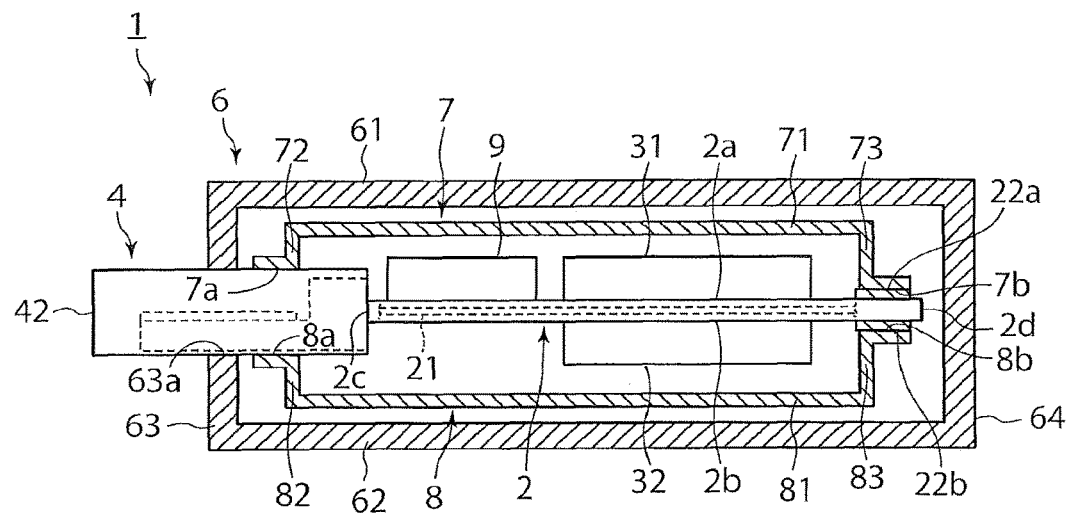
FIG. 4 is a schematic cross-sectional view of a semiconductor storage device showing a modification example of the first embodiment.

Next, a modification example of the first embodiment will be explained mainly about the points different from the semiconductor storage device 1 of FIG. 1. FIG. 4 is a schematic cross-sectional view of a semiconductor storage device 1 showing the modification example of the first embodiment.

As shown in FIG. 4, the semiconductor storage device 1 of the present modification example is further provided with, in addition to the configuration of the semiconductor storage device 1 of FIG. 1, a second memory package 32, which is an example of a second semiconductor memory.

The second memory package 32 is disposed on the second principal surface 2b. On the second principal surface 2b, the second memory package 32 is connected to predetermined wirings including the ground wiring 21. Moreover, the second memory package 32 can transmit/receive data at high speed to/from the controller 9 through the wirings.

The second plate-shaped member 8 is disposed between the second principal surface 2b and the bottom wall portion 62 so as to be separated from the second memory package 32 and the case 6.

According to the semiconductor storage device 1 of the present modification example, since the first plate-shaped member 7 and the second plate-shaped member 8 are provided, heat dissipation from the second memory package 32 can be efficiently carried out in high-speed operations of the second memory package 32. Moreover, the electromagnetic waves generated at the substrate 2 in the high-speed operations of the second memory package 32 can be shielded.

(Second Embodiment)

Figure 5:
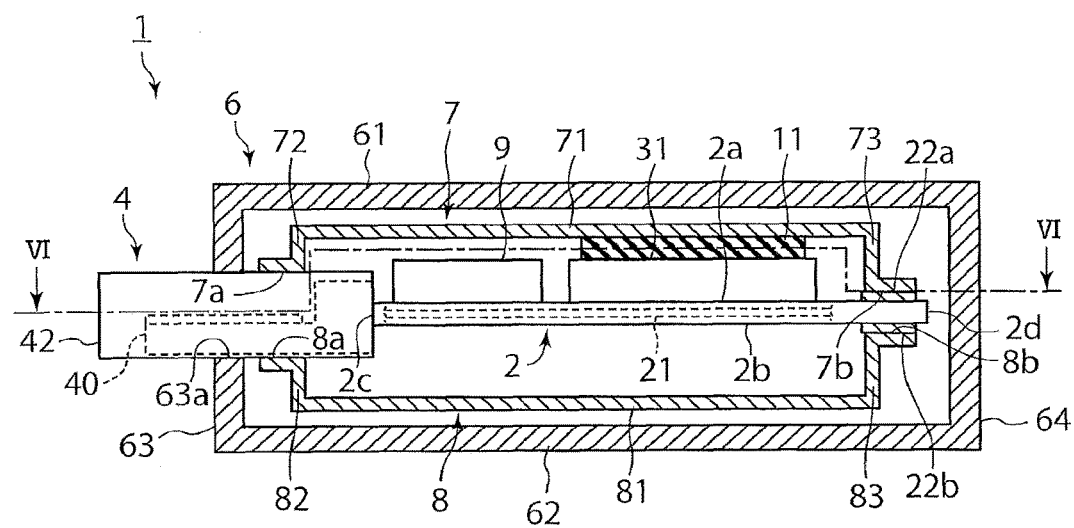
FIG. 5 is a schematic cross-sectional view of a semiconductor storage device showing a second embodiment.
Figure 6:
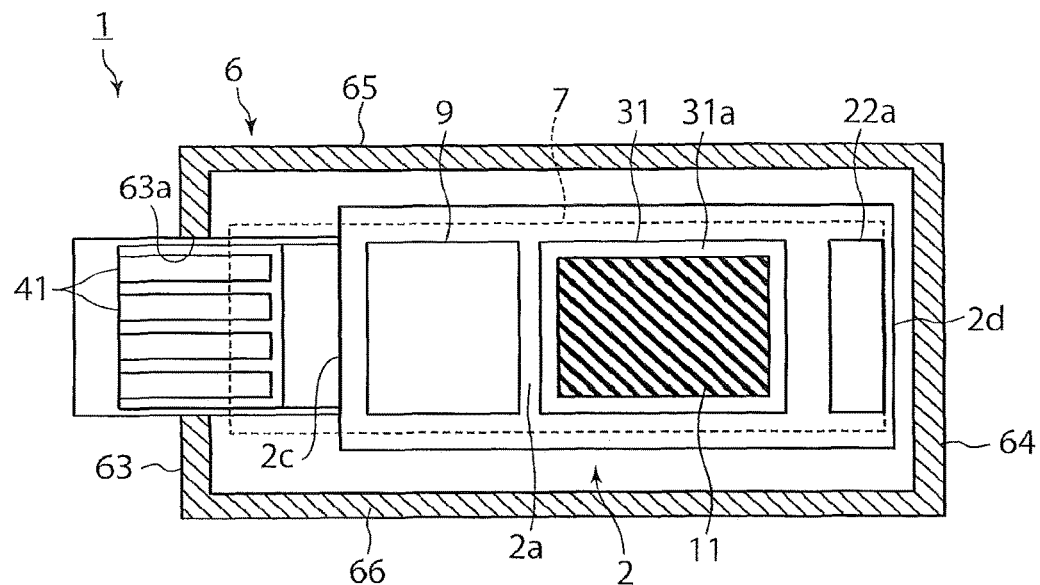
FIG. 6 is a VI-VI cross-sectional view of FIG. 5 showing the semiconductor storage device of the second embodiment.

Next, as a second embodiment, a semiconductor storage device further provided with a first member having thermal conductivity and an insulating property in addition to the first plate-shaped member and the second plate-shaped member will be explained. In the second embodiment, regarding constituent parts corresponding to the semiconductor storage device 1 of the first embodiment, redundant explanations will be omitted by using the same reference signs. FIG. 5 is a schematic cross-sectional view of the semiconductor storage device 1 showing the second embodiment. FIG. 6 is a VI-VI cross-sectional view showing the semiconductor storage device of the second embodiment.

As shown in FIG. 5, the semiconductor storage device 1 of the second embodiment is provided with, in addition to the configuration of FIG. 1, a first insulator 11, which is an example of the first member having thermal conductivity and an insulating property.

Between the first memory package 31 and the first plate-shaped member 7, the first insulator 11 is connected to the first memory package 31 and the first plate-shaped member 7. As shown in FIG. 6, the first insulator 11 is disposed across almost the entire area of an upper surface 31a of the first memory package 31. The first insulator 11 has thermal conductivity and an insulating property. The first insulator 11 may be resin or may be ceramic.

Figure 7:
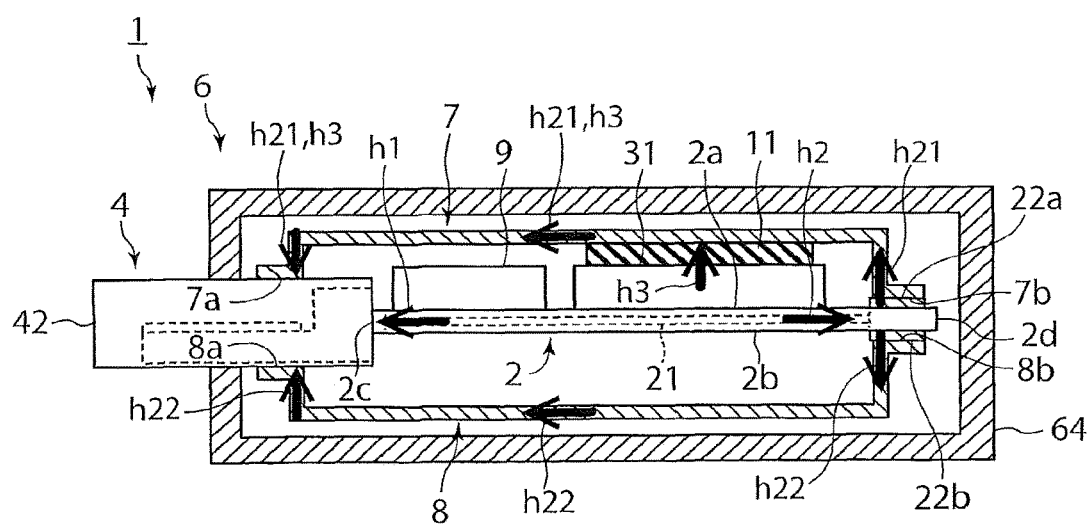
FIG. 7 is a schematic view showing the flows of heat in the semiconductor storage device of the second embodiment.

FIG. 7 is a schematic view showing the flows of heat in the semiconductor storage device 1 of the second embodiment.

As well as the first embodiment, the semiconductor storage device 1 of the second embodiment can release the heat h1, which is generated at a position close to the connector 4, to the connector 4 side through the ground wiring 21. Moreover, the semiconductor storage device 1 of the second embodiment can release the heat h2, which is generated at a position distant from the connector 4, to the holder 42 side through the ground wiring 21 the first plate-shaped member 7, and the second plate-shaped member 8.

Furthermore, as shown in FIG. 7, the semiconductor storage device 1 of the second embodiment can transmit heat h3, which is generated at the first memory package 31, directly to the first insulator 11 without the intermediation of the ground wiring 21. Then, the heat h3, which is transmitted to the first insulator 11, can be released to the holder 42 side through the first plate-shaped member 7, which is in contact with the first insulator 11.

According to the second embodiment, since the heat from the heat-generating first memory package 31 can be directly received by the first insulator 11, heat dissipation from the first memory package 31 can be more efficiently carried out.

(First Modification Example)

Figure 8:
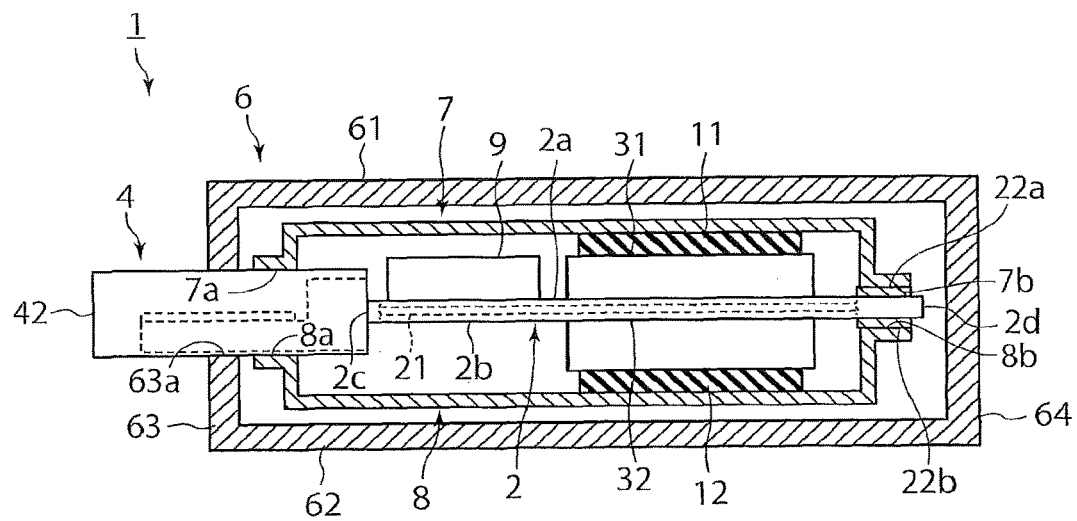
FIG. 8 is a schematic cross-sectional view of a semiconductor storage device showing a first modification example of the second embodiment.

Next, a first modification example of the second embodiment will be explained mainly about the points different from the semiconductor storage device 1 of FIG. 5. FIG. 8 is a schematic cross-sectional view of the semiconductor storage device 1 showing the first modification example of the second embodiment.

As shown in FIG. 8, the semiconductor storage device 1 of the first modification example is further provided with, in addition to the configuration of the semiconductor storage device 1 of FIG. 5, the second memory package 32 and a second insulator 12, which is an example of a second member having thermal conductivity and an insulating property. The configuration of the second memory package 32 is similar to that shown in FIG. 4.

Between the second memory package 32 and the second plate-shaped member 8, the second insulator 12 is connected to the second memory package 32 and the second plate-shaped member 8. The second insulator 12 has thermal conductivity and an insulating property. The second insulator 12 may be resin or may be ceramics.

According to the first modification example, since the heat from the heat-generating second memory package 32 can be directly received by the second insulator 12, heat dissipation from the second memory package 32 can be efficiently carried out.

(Second Modification Example)

Figure 9:
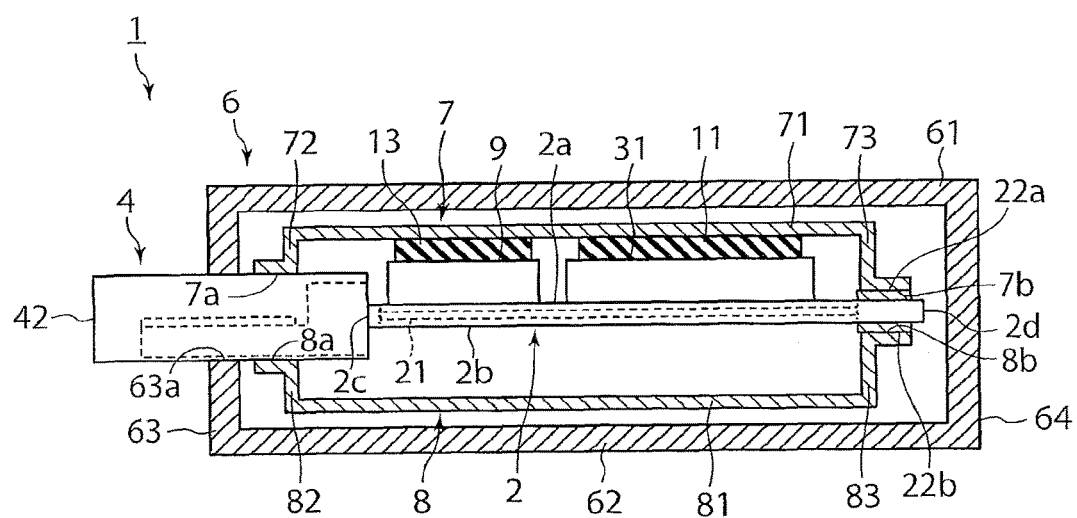
FIG. 9 is a schematic cross-sectional view of a semiconductor storage device showing a second modification example of the second embodiment.

Next, a second modification example of the second embodiment will be explained mainly about the points different from the semiconductor storage device 1 of FIG. 5. FIG. 9 is a schematic cross-sectional view of the semiconductor storage device 1 showing the second modification example of the second embodiment.

As shown in FIG. 9, the semiconductor storage device 1 of the second modification example is further provided with, in addition to the configuration of the semiconductor storage device 1 of FIG. 5, a third insulator 13, which is an example of a third member having thermal conductivity and an insulating property.

Between the controller 9 and the first plate-shaped member 7, the third insulator 13 is connected to the controller 9 and the first plate-shaped member 7. The third insulator 13 has thermal conductivity and an insulating property. The third insulator 13 may be resin or may be ceramics.

According to the second modification example, since the heat from the heat-generating controller 9 can be directly received by the third insulator 13, heat dissipation from the controller 9 can be more efficiently carried out. The controller 9 may be disposed on the second principal surface 2b in a state in which it is separated from the second plate-shaped member 8, and an insulator connected to the controller 9 and the second plate-shaped member 8 may be provided between the controller 9 and the second plate-shaped member 8. Also in this case, as well as the configuration of FIG. 9, heat dissipation from the controller 9 can be efficiently carried out.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a substrate that comprises a plurality of wirings, a first end portion, and a second end portion;
a terminal portion that is connected to the substrate at the first end portion and comprises a terminal connected to the wirings;
a connector to connect to a host device, the connector comprises a holder that surrounds the terminal portion;

a first semiconductor memory that is disposed on a first principal surface of the substrate, is disposed between the first end portion and the second end portion, and is connected to the wirings;

a controller that is disposed on the first principal surface of the substrate, is disposed between the first end portion and the first semiconductor memory, and is connected to the wirings and controls the first semiconductor memory;

a case that houses part of the holder, the substrate, the first semiconductor memory and the controller; and a first plate-shaped member that is disposed between the first principal surface and a first wall portion of the case facing the first principal surface separated from the first semiconductor memory, the controller, and the case, is connected to the holder at a first end of the first plate-shaped member, is connected to the second end portion at a second end of the first plate-shaped member, and comprises thermal conductivity, wherein the first plate-shaped member comprises electrical conductivity and is connected to a ground wiring of the wirings on the first principal surface on the second end portion side, the first plate-shaped member is larger than the ground wiring in a direction vertical to a direction from the first end portion to the second end portion, the direction from the first end portion to the second end portion is along a direction from the first end of the first plate-shaped member to the second end of the first plate-shaped member, and the first end of the first plate-shaped member and the second end of the first plate-shaped member do not overlap the first semiconductor memory and the controller in a direction vertical to the first principal surface of the substrate.

2. The semiconductor storage device according to claim 1, comprising a second plate-shaped member that is disposed between a second principal surface of the substrate on an opposite side of the first principal surface and a second wall portion of the case facing the second principal surface separated from the case, is connected to the holder at a first end, is connected to the second principal surface on the second end portion side at a second end, and comprises thermal conductivity.

3. The semiconductor storage device according to claim 1, comprising a second plate-shaped member that is disposed between a second principal surface of the substrate on an opposite side of the first principal surface and a second wall portion of the case facing the second principal surface separated from the case, is connected to the holder at a first end, is connected to the second principal surface on the second end portion side at a second end, and comprises thermal conductivity.

4. The semiconductor storage device according to claim 2, comprising a second semiconductor memory that is disposed on the second principal surface and is connected to the wirings; wherein the second plate-shaped member is disposed separated from the second semiconductor memory.

5. The semiconductor storage device according to claim 3, comprising a second semiconductor memory that is disposed on the second principal surface and is connected to the wirings; wherein the second plate-shaped member is disposed separated from the second semiconductor memory.

6. The semiconductor storage device according to claim 2, wherein the second plate-shaped member comprises electrical conductivity and is connected to a ground wiring of the wirings on the second principal surface on the second end portion side.

7. The semiconductor storage device according to claim 3, wherein the second plate-shaped member comprises electrical conductivity and is connected to a ground wiring of the wirings on the second principal surface on the second end portion side.

8. The semiconductor storage device according to claim 4, wherein the second plate-shaped member comprises electrical conductivity and is connected to a ground wiring of the wirings on the second principal surface on the second end portion side.

9. The semiconductor storage device according to claim 5, wherein the second plate-shaped member comprises electrical conductivity and is connected to a ground wiring of the wirings on the second principal surface on the second end portion side.

10. The semiconductor storage device according to claim 1, wherein the first plate-shaped member contains metal.

11. The semiconductor storage device according to claim 6, wherein the second plate-shaped member contains metal.

12. The semiconductor storage device according to claim 1, comprising a first member that is connected to the first semiconductor memory and the first plate-shaped member between the first semiconductor memory and the first plate-shaped member and comprises thermal conductivity and an insulating property.

13. The semiconductor storage device according to claim 4, comprising a second member that is connected to the second semiconductor memory and the second plate-shaped member between the second semiconductor memory and the second plate-shaped member and comprises thermal conductivity and an insulating property.

14. The semiconductor storage device according to claim 1, comprising a third member that is connected to the controller and the first plate-shaped member between the controller and the first plate-shaped member and comprises thermal conductivity and an insulating property, and wherein the third member comprises resin or ceramic.

15. The semiconductor storage device according to claim 12, wherein the first member comprises resin or ceramic.

16. The semiconductor storage device according to claim 13, wherein the second member comprises resin or ceramic.

17. The semiconductor storage device according to claim 1, wherein the first plate-shaped member is separated from the holder except at the first end and is separated from the substrate except at the second end.

18. The semiconductor storage device according to claim 1, wherein the first plate-shaped member has smaller thermal resistance compared with the ground wiring.

19. The semiconductor storage device according to claim 5, wherein the first plate-shaped member and the second plate-shaped member shield the electromagnetic waves generated at the substrate by the operations of the controller, the first semiconductor memory, and the second semiconductor memory.

20. The semiconductor storage device according to claim 19, wherein the second plate-shaped member comprises electrical conductivity and is connected to the ground wiring.

\* \* \* \* \*